United States Patent
Terada et al.

(10) Patent No.: US 9,541,617 B2
(45) Date of Patent: Jan. 10, 2017

(54) GRADIENT COIL DEVICE AND MAGNETIC RESONANCE IMAGING DEVICE

(75) Inventors: Masanao Terada, Naka (JP); Mitsushi Abe, Hitahinaka (JP); Yukinobu Imamura, Hitachi (JP); Hiroyuki Takeuchi, Kashiwa (JP); Akira Kurome, Kashiwa (JP)

(73) Assignee: Hitachi, Ltd., Tokyo (JP)

( * ) Notice: Subject to any disclaimer, the term of this patent is extended or adjusted under 35 U.S.C. 154(b) by 725 days.

(21) Appl. No.: 13/979,542

(22) PCT Filed: Jan. 13, 2012

(86) PCT No.: PCT/JP2012/050547
§ 371 (c)(1),
(2), (4) Date: Sep. 6, 2013

(87) PCT Pub. No.: WO2012/096363
PCT Pub. Date: Jul. 19, 2012

(65) Prior Publication Data
US 2013/0335088 A1    Dec. 19, 2013

(30) Foreign Application Priority Data
Jan. 14, 2011  (JP) ................................ 2011-005555

(51) Int. Cl.
*G01R 33/385*    (2006.01)
*G01R 33/421*    (2006.01)

(52) U.S. Cl.
CPC ......... *G01R 33/385* (2013.01); *G01R 33/4215* (2013.01)

(58) Field of Classification Search
CPC .............. G01R 33/385; G01R 33/3852; G01R 33/3858; G01R 33/3854
See application file for complete search history.

(56) References Cited

U.S. PATENT DOCUMENTS

| 4,820,988 A | 4/1989 | Crooks et al. |
| 5,642,049 A * | 6/1997 | Harada ................ G01R 33/385 |
| | | 29/835 |

(Continued)

FOREIGN PATENT DOCUMENTS

| JP | 02-001238 A | 1/1990 |
| JP | 2001/112737 A | 4/2001 |

(Continued)

OTHER PUBLICATIONS

Chinese Office Action received in corresponding Chinese Application No. 201280005427.X dated Feb. 2, 2015.

*Primary Examiner* — Clayton E Laballe
*Assistant Examiner* — Ruifeng Pu
(74) *Attorney, Agent, or Firm* — Mattingly & Malur, PC

(57) ABSTRACT

A gradient coil device includes a major axis gradient coil, having an ellipse in a cross section generating a gradient magnetic field inclined in a major axis direction of the ellipse at a magnetic field space; and a minor axis gradient coil, having an ellipse in a cross section generating a gradient magnetic field inclined in a minor axis direction of the ellipse at the magnetic field space. A length of the minor axis field coil in the center axis direction is shorter than a length of the major axis gradient coil in the center axis direction. A maximum value of a residual magnetic field generated by the minor axis gradient coil at a space outside the magnetic field space is equal to or smaller than a maximum value of a residual magnetic field generated by the major axis gradient coil at a space outside the magnetic field space.

8 Claims, 12 Drawing Sheets

(56) References Cited

U.S. PATENT DOCUMENTS

| | | | |
|---|---|---|---|
| 6,448,774 B1 | 9/2002 | Heid | |
| 6,556,012 B2 | 4/2003 | Yamashita | |
| 6,630,829 B1* | 10/2003 | Liu | G01R 33/385 324/318 |
| 2001/0022515 A1 | 9/2001 | Yamashita et al. | |
| 2002/0171425 A1 | 11/2002 | Yui et al. | |
| 2003/0006773 A1* | 1/2003 | Ries | G01R 33/385 324/318 |
| 2005/0258923 A1* | 11/2005 | Arz | G01R 33/3854 335/216 |
| 2006/0033496 A1* | 2/2006 | Shvartsman | G01R 33/385 324/318 |
| 2008/0246480 A1* | 10/2008 | Kawamoto | G01R 33/385 324/318 |
| 2012/0176137 A1* | 7/2012 | Terada | G01R 33/385 324/322 |
| 2012/0235685 A1* | 9/2012 | Abe | G01R 33/20 324/322 |
| 2014/0210476 A1* | 7/2014 | Kawamura | G01R 33/389 324/322 |
| 2014/0274721 A1* | 9/2014 | Calvert | G01R 33/3815 505/162 |
| 2015/0346297 A1* | 12/2015 | Naka | G01R 33/3858 324/322 |
| 2015/0346305 A1* | 12/2015 | King | G01R 33/5611 324/309 |
| 2015/0369884 A1* | 12/2015 | Sakakura | G01R 33/3856 324/322 |

FOREIGN PATENT DOCUMENTS

| | | |
|---|---|---|
| JP | 2001-212107 A | 8/2001 |
| JP | 2001-327478 A | 11/2001 |
| JP | 2002-102207 A | 4/2002 |
| JP | 2007-175438 A | 7/2007 |
| JP | 2007-296195 A | 11/2007 |
| JP | 2011072461 A * | 4/2011 |

* cited by examiner

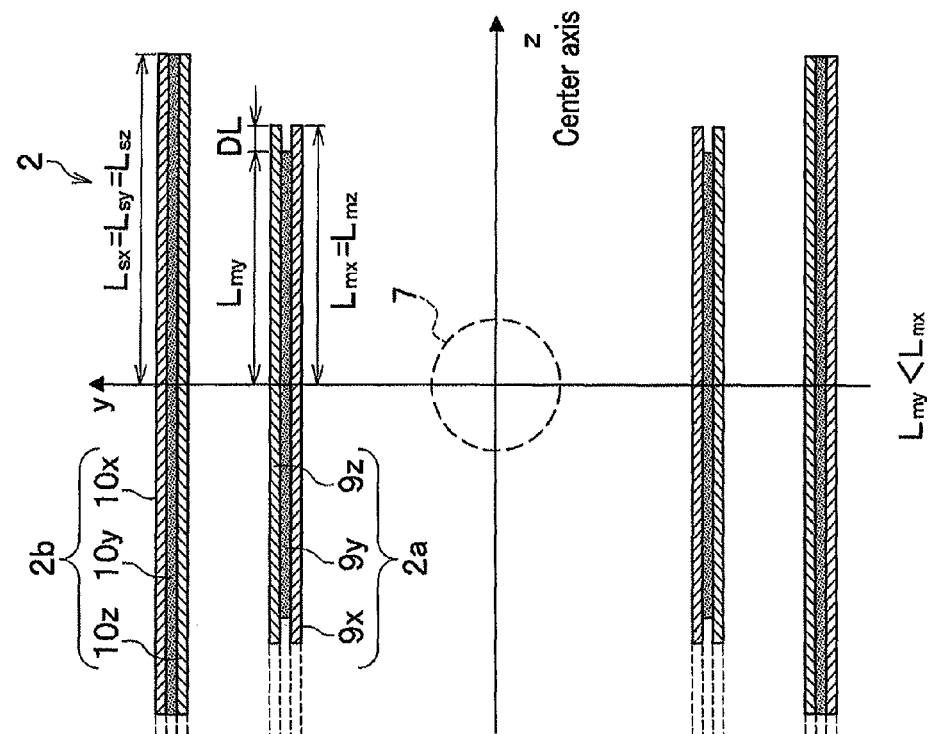
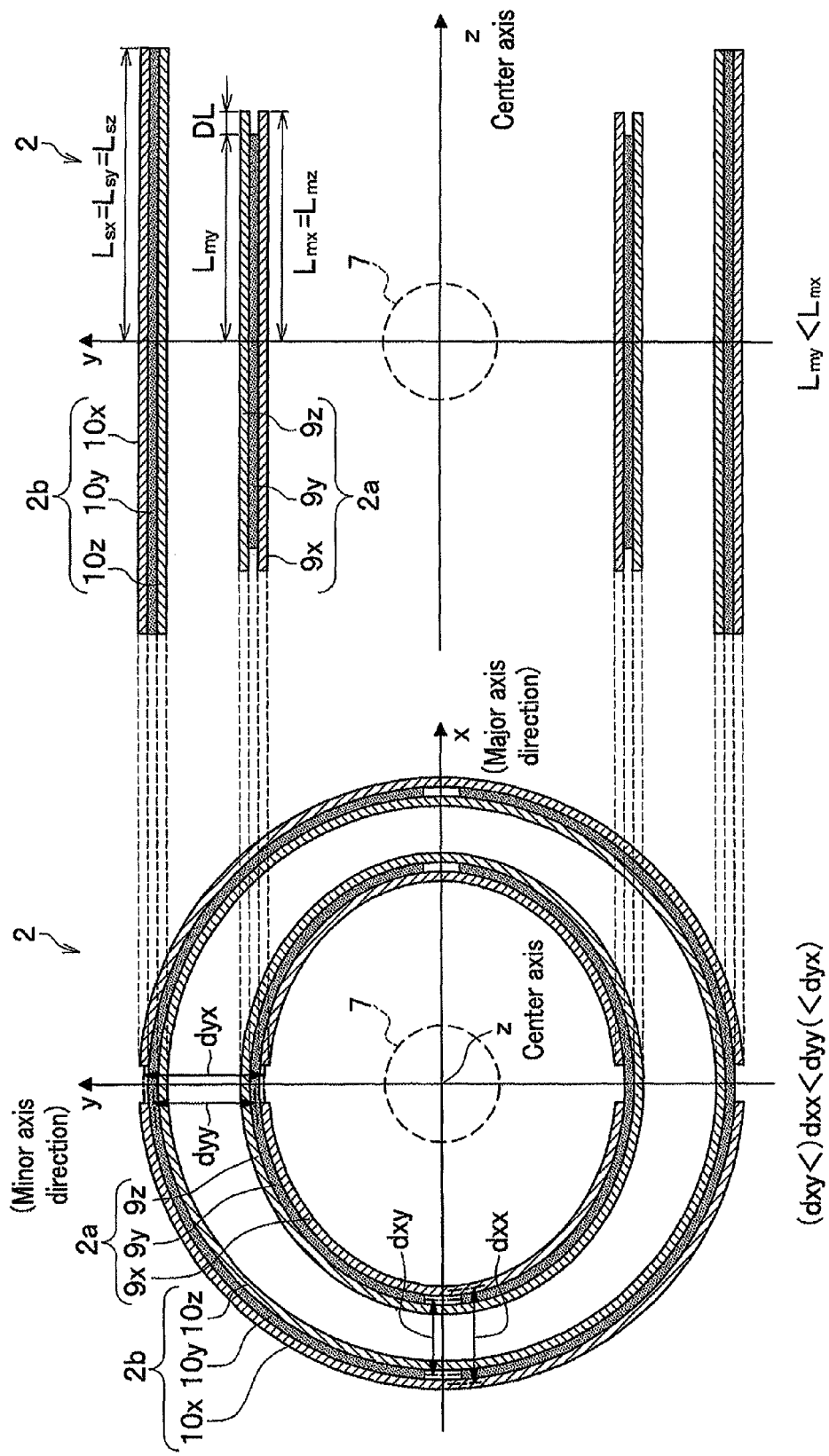

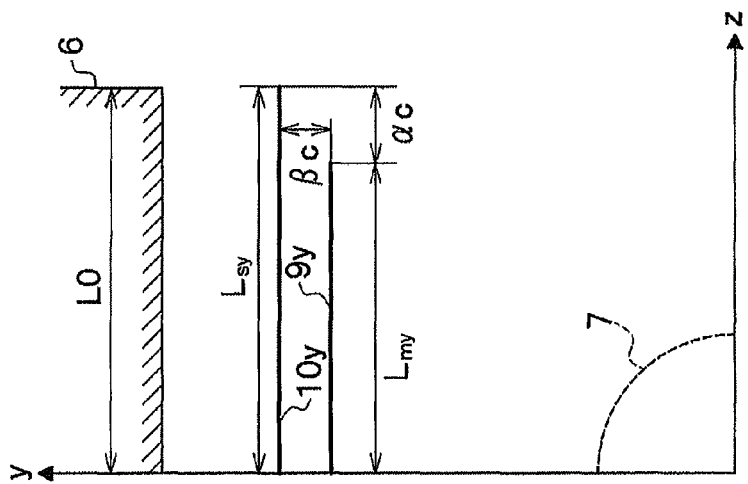
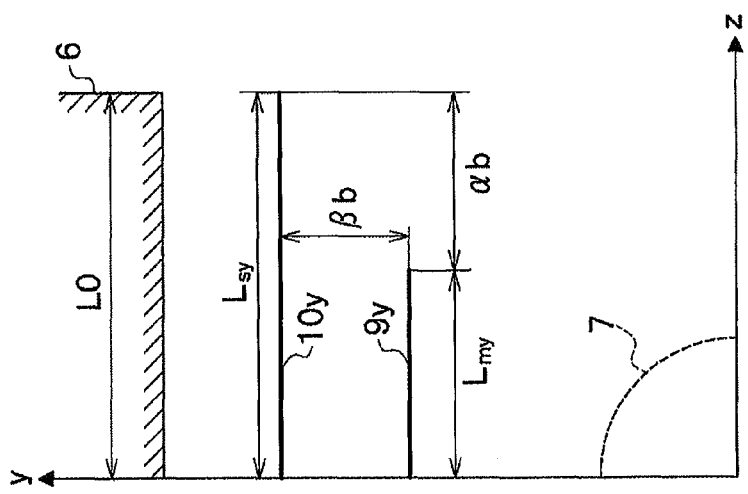
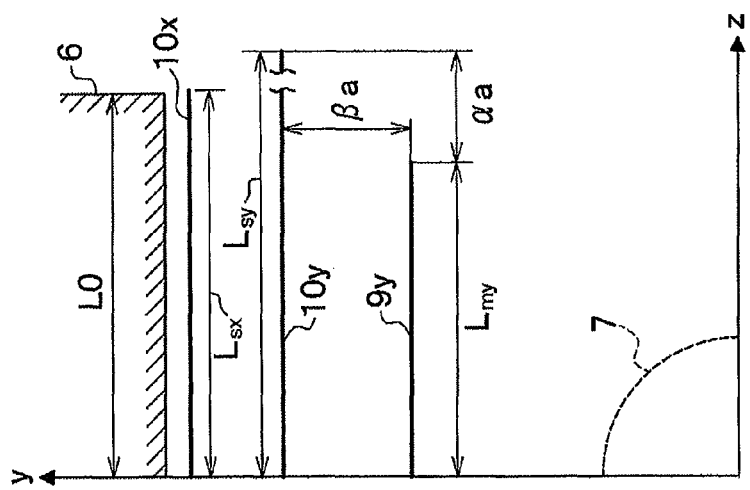

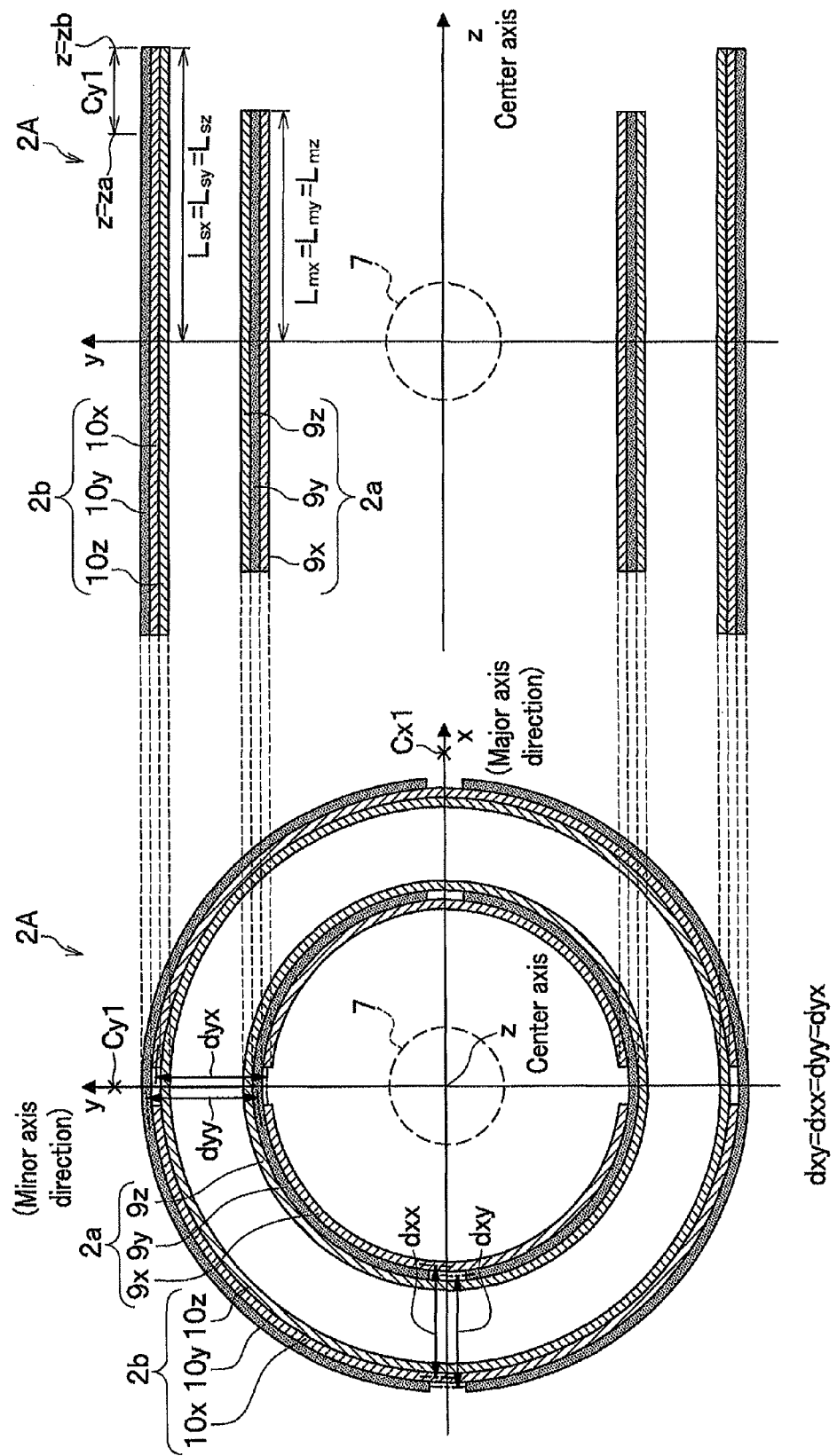

(Comparative example 2)

(Comparative example 2)

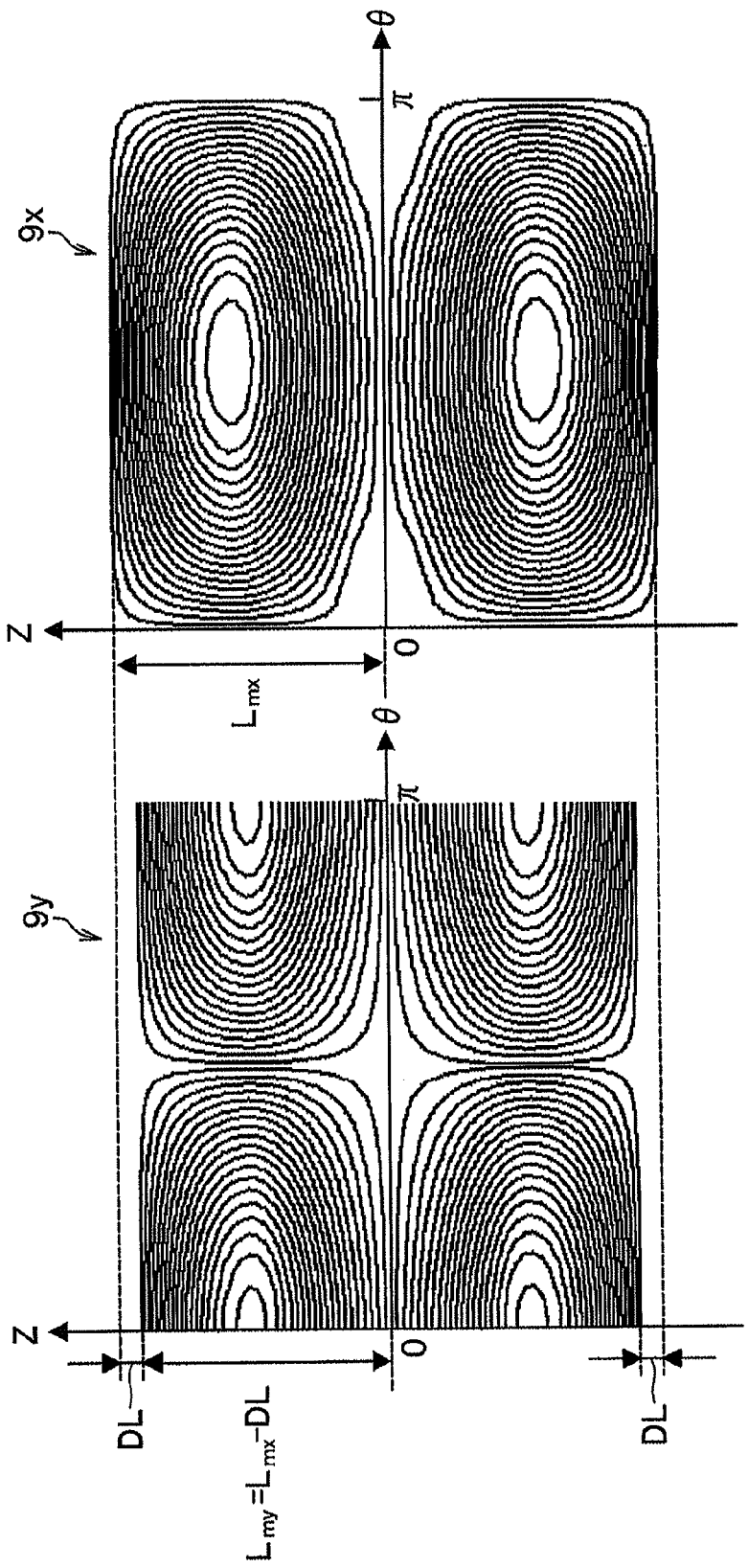

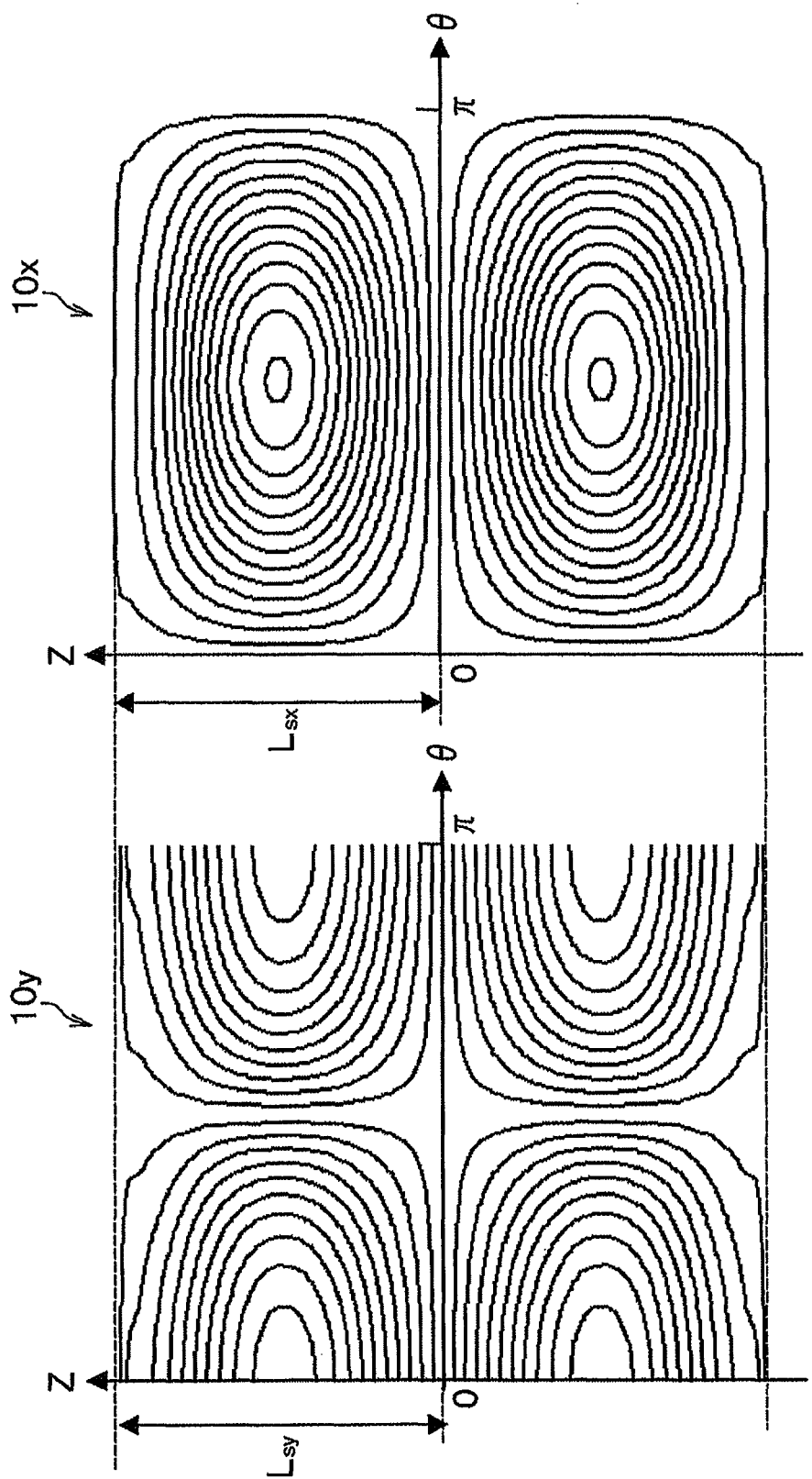

GRADIENT COIL DEVICE AND MAGNETIC RESONANCE IMAGING DEVICE

TECHNICAL FIELD

The present invention relates to a gradient coil device and a magnetic resonance imaging device including the gradient coil device.

BACKGROUND ART

In magnetic resonance imaging (MRI; Magnetic Resonance Imaging) devices, a target body (generally, a human being) is inserted into a static magnetic field (imaging region) generated by a magnet device, the target body is irradiated with RF pulses. A magnetic resonance signal generated in the target body is received, and a tomographic image for a medical diagnosis is obtained. During this, a gradient coil device generates, in an imaging region on which the target body is placed, pulsed gradient magnetic fields of which intensities linearly vary: in an axial direction of the double hollow circular cylinder shapes of a magnet device (a z axis direction); a lateral direction which is vertical to the z axis direction and in parallel to a floor (x axis direction); and a vertical direction (a y axis direction) which is vertical to the z axis direction, the x axis direction, and the floor, respectively. This adds position information in the target body (imaging region) to the magnetic resonance signal. On the other hand, the gradient coil device generates unnecessary magnetic fields (residual magnetic fields) in a region outside the imaging region. The residual magnetic field generates eddy currents in structures therearound and magnetic fields caused by the eddy currents adversely influence the tomographic image. Accordingly, the MRI device is provided with a shield coil through which a current flows in a direction opposite to that of the main coil in addition to the main coil generating the gradient magnetic field to suppress the residual magnetic field.

The gradient coil generally has a hollow circular cylinder shape having a cross section vertical to the z axis which is a circle and extends along an inner sleeve wall of a magnet device having the double hollow circular cylinder shapes. However, to reduce an oppressive feeling that the target body receives when the target body is inserted into the inner sleeve of the gradient coil, there is a proposal to modify the shape of the circle on the cross section to have an oblong shape to be made closer to a cross section shape of the human body (for example, Patent document 1, etc.). In Patent document 1, a shape on the cross section vertical to the z axis of the main coil and the shield coil of the gradient coil is an oblong shape, i.e., an ellipse shape. Further, in Patent document 1, a gradient coil has been proposed which includes a main coil having an ellipse shape on the cross section and a shield coil, disposed outside the main coil and having a circle on the cross section.

As described above, in the ellipse which is oblong, a major axis of the ellipse is directed to the x direction and a minor axis is directed in the y direction. Accordingly, an x main coil (a major axis gradient coil) for generating a gradient magnetic field in the x direction and a y main coil (a minor axis gradient coil) for generating a gradient magnetic field in the y direction are formed with such an ellipse which is oblong. In this case, because a distance to a center (in the z axis) of the imaging region from a position at a middle of one of a pair of the y main coils is longer than a distance from a position (on the x axis) at a middle of one of a pair of the x main coils, it is necessary to increase a magnetic energy for the x main coils to generate magnetic fields with the x main coils and the y main coils to have the same intensity in the imaging region. In Patent document 2, to solve this problem, the x main coils are arranged inside the y main coils (on a side of the imaging region), and y shields coil (miner axis shield coils) are arranged inside the x shield coils (major axis shield coils) (on a side of the imaging region).

Further, in Patent document 3, to suppress the eddy current to a minimum level, a gradient coil device has been proposed in which a length of the shield coil in the z direction is made longer than a length of the magnet device in the z direction.

PRIOR ART DOCUMENT

Patent Document

Patent document 1: JP 2001-327478 A
Patent document 2: JP 2007-296195 A
Patent document 3: JP 2001-212107 A

SUMMARY OF INVENTION

Problems to be Solved by the Invention

Will be considered a case where main coils of the gradient coil closer to the imaging region are formed to have ellipses on a cross section vertical to the z axis to reduce the oppressive feeling for the target body to be inserted into inner sleeve walls of the gradient coil, and shield coils for the gradient coils closer to the magnet device is formed to have a circle shape on a cross section vertical to the z axis to match an inner circumferential wall (generally circular) of the magnet device. In this case, the x main coils (major axis gradient coil) for generating a gradient magnetic field in the major axis (major axis) of the ellipse of the main coils includes a pair of coils facing in the x direction across the z axis (center axis) of the main coils. The y main coils (minor axis gradient coils) for generating a gradient magnetic field in the minor axis (short diameter) includes a pair of coils facing each other in the y direction across the z axis (center axis). The centers of respective coils of the y main coils are closer to the z axis which is a center of the imaging region where the gradient magnetic fields are generated than the centers of the respective coils of the x main coils, but more remote from the shield coils. When the main coils are arranged apart from the shield coils, a sufficient magnetic shielding effect cannot be obtained. Accordingly, the residual magnetic fields from the y main coils become larger in intensity than the x main coils. To suppress the residual magnetic field, a length of the shield coil in the z direction can be extended. However, because this results in an increase in the length of the whole of the MRI device, it is desirable to match the length of the shield coil in the z direction approximately to the length of the magnet device to reduce the oppressive feeling for the target body.

The present invention aims to provide a gradient coil device capable of reducing residual magnetic fields of the y main coils without a length of the shield coil in the z direction elongated as possible as the situation allows and to provide an MRI device including the gradient coil device.

Measure For Solving Problems

To achieve the aim, the present invention provides a gradient coil device, comprising:

a major axis gradient coil (x main coil), having a cross sectional shape vertical to a center axis direction which shape is an ellipse, configured to generate a gradient magnetic field having a magnetic intensity inclined in a major axis direction of the ellipse at a magnetic field space (imaging region); and a minor axis gradient coil (y main coil), having a cross sectional shape vertical to the center axis direction, which shape is an ellipse, configured to generate a gradient magnetic field having a magnetic intensity inclined in a minor axis direction of the ellipse at the magnetic field space, wherein a length of the minor axis gradient coil (y main coil) in the center axis direction is shorter than a length of the major axis gradient coil (x main coil) in the center axis direction.

Further, the present invention provides an MRI device including the gradient coil device.

Advantageous Effect

According to the present invention, there is provided a gradient coil capable of reducing residual magnetic fields from the y main coil (minor axis gradient coil) without a length of the shield coil in a z direction extended as possible as a situation allows.

BRIEF DESCRIPTION OF DRAWINGS

FIG. 1A is a cross section view of a gradient coil device according to a first embodiment of the present invention, taken on an xy plane, and FIG. 1B is a cross section view the gradient coil device taken on a yz plane.

FIGS. 4A to 4C show arrangement views illustrating positional relations between a y main coil (minor axis gradient coil) and a y shield coil (minor axis shield coil), wherein FIG. 4A shows a case where a length of the y shield coil in a z direction is sufficiently long (a modification 1 in the first embodiment), FIG. 4B shows a case where a length of the y main coil in the z direction is sufficiently shorter than that of the y shield coil (a modification 2 of the first embodiment), FIG. 4C shows a case where a gap between the y main coil and the y shield coil is sufficiently narrower than a difference between lengths of the y main coil and the y shield coil (a modification 3 of the first embodiment).

FIG. 5A is a cross section view of the gradient coil device of a comparative example 1 taken on the xy plane, and FIG. 5B is a cross section view of the gradient coil device of the comparative example 1 taken on the yz plane.

FIGS. 10A and 10B show coil patterns, wherein FIG. 10A shows a coil pattern of the y main coil (minor axis gradient coil) extended in a circumferential direction (θ direction) of the center axis (z axis), and FIG. 10B shows a coil pattern of the x main coil (major axis gradient coil) extended in the circumferential direction (θ direction) of the center axis (z axis).

FIG. 12 shows coil patterns, wherein FIG. 12A shows a coil pattern of the y shield coil (minor axis shield coil) extended in the circumferential direction (θ direction) of the center axis (z axis), and FIG. 12B shows a coil pattern of the x shield coil (major axis gradient coil) extended in the circumferential direction (θ direction) of the center axis (z axis).

MODES FOR CARRYING OUT THE INVENTION

Will be described embodiments of the present invention in detail referring to drawings, if necessary.

In each figure, the part corresponding to another part will be designated with the same reference and thus a duplicated description will be omitted.

(First Embodiment)

Figure 2:
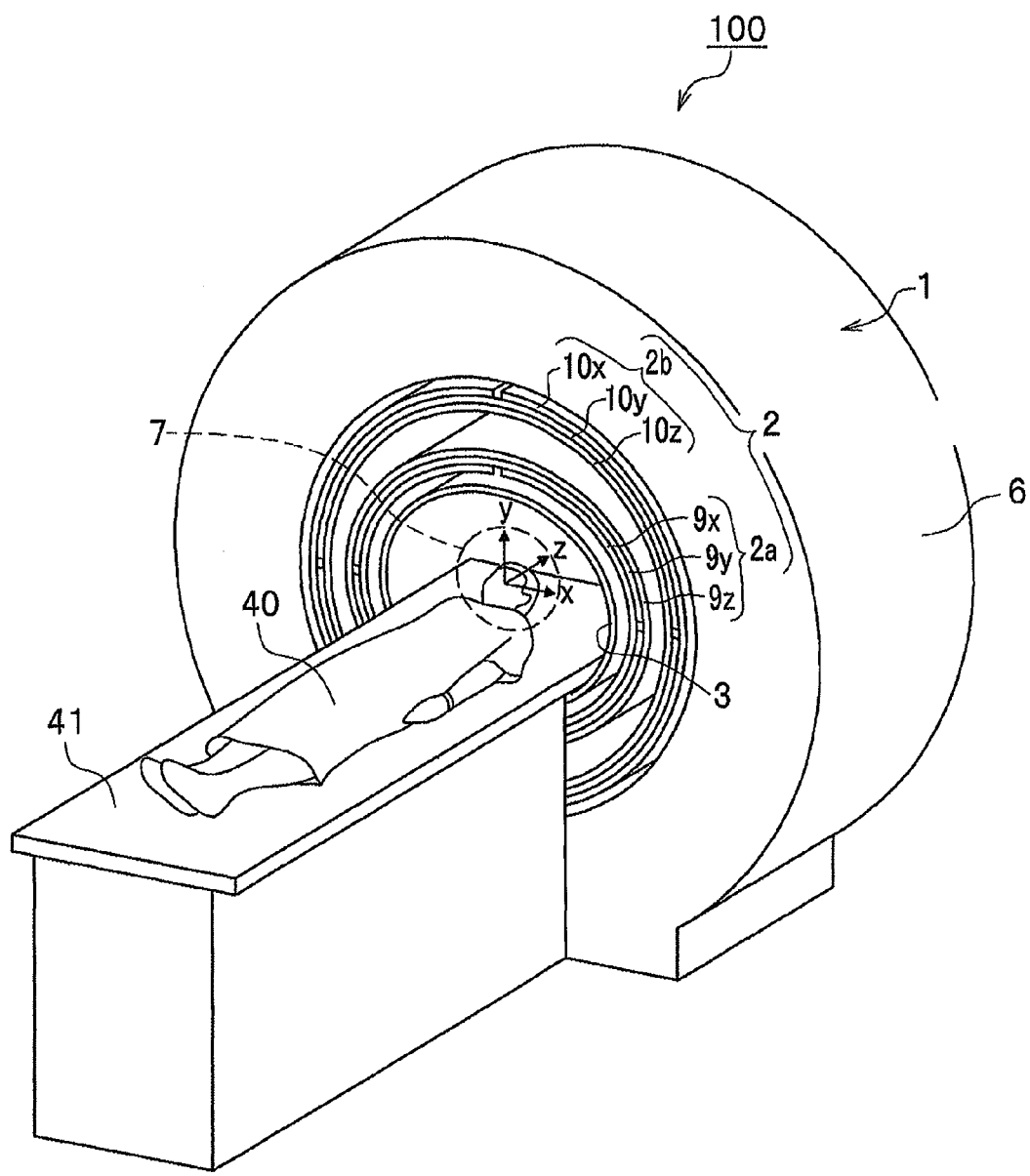
FIG. 2 is a perspective view of the magnetic resonance imaging device according to the first embodiment of the present invention.

FIG. 2 is a perspective view of a magnetic resonance imaging (MRI) device 100 according to a first embodiment of the present invention. The magnetic resonance imaging device 100 includes a magnet device 1 configured to generate a homogeneous static magnetic field in an imaging region 7 into which a target body 40 is inserted in a status in which the target body 40 is kept lying on a bed 41 to provide positional information in the imaging region 7; a gradient coil device 2 configured to generate in pulsate state a gradient magnetic field with a partial gradient slope in a magnetic field intensity; an RF coil 3 configured to irradiate the target body 40 with a high frequency pulse; a receiving coil (not shown) configured to receive a magnetic resonance signal from the target body 40; and a computer system (not shown) configured to process the magnetic resonance signal to display the tomographic image. Accordingly to the magnetic resonance imaging device 100, the tomographic image showing physical and chemical characteristics of the target body 40 using a nuclear magnetic resonance phenomenon generated when the target body 40 placed in the homogeneous static magnetic field (imaging region 7) is irradiated with the high frequency pulse. The tomographic image is used particularly for medical purposes. The magnet device 1, the gradient coil device 2, and an RF coil 3 have sleeve shapes with centers substantially agreeing each other, directed in the z axis direction. In addition, the y axis direction is set to an upper side in a vertical direction. The x axis direction is set to a horizontal direction and in an advance direction of a screw which is turned from the z axis direction toward the y axis direction. An outer circumferential of the magnet device 1 is configured with a vacuum vessel 6 which is a hollow circular cylinder container. Inside an inner sleeve wall of the vacuum vessel 6 which is the hollow circular cylinder container (outside of the hollow sleeve container) there are arranged the gradient coil device 2 and the RF coil 3.

The gradient coil device 2 has the main coil 2a arranged on the side of the imaging region 7, and a shield coil 2b arranged on a side of the vacuum vessel 6. The main coil 2a generates a gradient field in the imaging region 7, and a so-called residual magnetic field in a region where the vacuum vessel 6, which is the hollow circular cylinder. To suppress the residual magnetic field to the region where the vacuum vessel 6, which is the hollow circular cylinder container, is placed, a current is caused to flow through the shield coil 2b in a direction opposite to the main coil 2a.

The main coil 2a includes a z main coil (center axis gradient coil) 9z for generating a gradient magnetic field of which magnetic field intensity linearly varies in the z axis, an x main coil (major axis gradient coil) 9x for generating a gradient magnetic field of which magnetic intensity varies linearly in the x axis direction, a y main coil (minor axis gradient coil) 9y for generating a gradient magnetic field of which magnetic intensity varies linearly in the y axis direction. Pulsated currents are sequentially applied to the z main coil 9z, the x main coil 9x, and the y main coil 9y to generate the gradient magnetic fields inclined in respective directions to add positional information of the target body 40 (the imaging region 7) to the magnetic resonance signal.

A shield coil 2b includes a z-shield coil (center axis shield coil) 10z for suppressing the residual magnetic field generated by the z main coil 9z and an x shield coil (major axis shield coil) 10x for suppressing a residual magnetic field generated by the x main coil 9x; and a y shield coil (minor axis shield coil) 10y for suppressing a residual magnetic field generated by the y main coil 9y.

Figure 3:
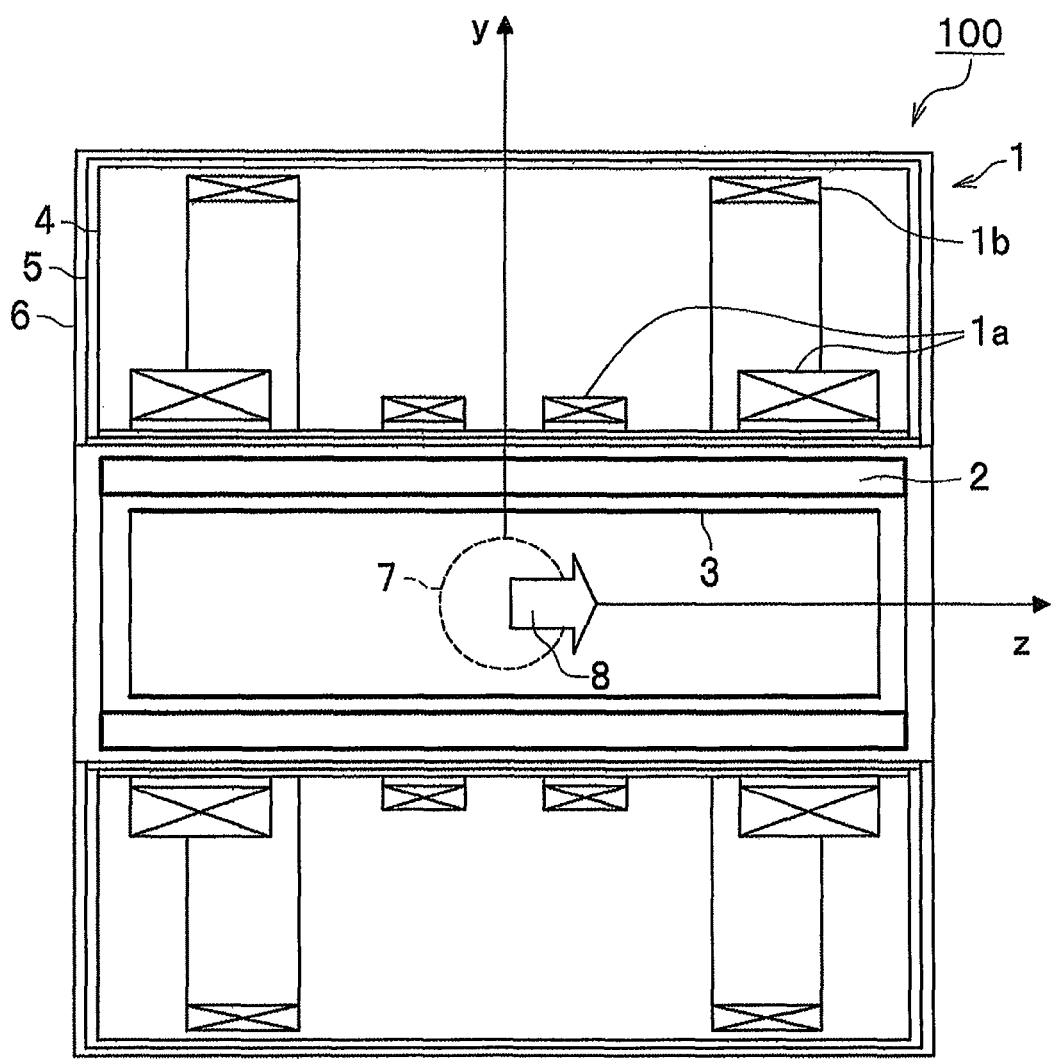
FIG. 3 is a cross section view of the magnetic resonance imaging device according to the first embodiment, taken on the yz plane.

FIG. 3 shows a cross section view in which an MRI device 100 according to the first embodiment of the present invention, taken on a plane including the y axis and the z axis (a yz plane). The MRI device 100 is a horizontal magnetic field type of MRI device in which a direction of a static magnetic field 8 formed in the imaging region 7 is a horizontal direction (z axis direction). In addition, the x axis, the y axis, and the z axis are set to be perpendicular to each other as described above, and the origin is set at a center of the imaging region 7, i.e., around a center of the vacuum vessel 6 which is the hollow circular cylinder container. The magnet device 1 includes static magnetic field main coils 1a and static magnetic field shield coils 1b for suppressing a leakage of the static magnetic field around there to from a pair on both left and right sides of a plane of z=0 (parts of z<0 and z>0). These coils 1a and 1b have circular ring shapes with a common center axis on the z axis. An inner diameter of the static magnetic field shield coil 1b is greater than an outer diameter of a static magnetic field main coil 1a. These coils 1a and 1b frequently provided with superconducting coils, in which case the coils are housed in a container with a three-layer structure. First, the coils 1a, 1b are housed in a helium container 4 together with liquid helium (He) as a coolant. The helium container 4 is enclosed in a radiation shield 5 for blocking heat radiation into the inside of the helium container 4. The vacuum vessel 6, which is a hollow circular cylinder container, houses the helium container 4 and the radiation shield 5 and keep the inside evacuated. Because the vacuum vessel 6 is evacuated therein, through the vacuum vessel 6 is disposed in a room at a room temperature, it is prevented for heat in the room to transmit to the helium container 4 by conduction or convection. Further, the radiation shield 5 suppresses transmission of heat in the room from the vacuum vessel 6 to the helium container 4 by radiation. Accordingly the coils 1a, 1b can be stably set at a cryogenic temperature which is a temperature of liquid helium so as to function as a superconducting magnet. For the helium container 4, the radiation shield 5, and the vacuum vessel 6, non-magnetic members are used not to generate unnecessary magnetic field. In addition a nonmagnetic metal, being easy to hold an evacuated condition, is used. Accordingly, the helium container 4, the radiation shield 5, and particularly, the vacuum vessel 6 disposed at the outermost circumference, are in such situations that eddy currents are easily generated.

The gradient coil device 2 has a hollow cylinder like shape and disposed to enclose the RF coil 3 and the imaging region 7 therein. An outer hollow cylinder wall of the gradient coil device 2 is formed along an inner hollow cylinder wall of the vacuum vessel 6, which is a hollow circular cylinder type container, to face the inner hollow cylinder wall.

The RF coil 3 also has a tube like shape and disposed to enclose the imaging region 7. An outer hollow cylinder wall of the RF coil 3 is formed along the inner sleeve wall of the gradient coil device 2 to face the inner hollow cylinder wall. The RF coil 3 irradiates the imaging region 7 with high frequency pulses. The receiving coil (not shown) receives the magnetic resonance signal from the target body 40 and transits the signal to the computer system (not shown). When receiving the magnetic resonance signal from the receiving coil, the computer system processes the magnetic resonance signal to generate and display a tomographic image of the target body 40.

FIG. 1A shows a cross section view in which the gradient coil device 2 according to the first embodiment of the present invention is taken on a plane including the x axis and the y axis (xy plane). Outside the (gradient magnetic field) main coil 2a, the (gradient magnetic field) shield coil 2b is disposed. A cross sectional shape of the (gradient magnetic field) main coil 2a has a cross section of which shape is an ellipse and a cross section shape of the shield coil 2b is a (perfect) circle. The (gradient magnetic field) main coil 2a has a major axis (longer diameter) in the x axis direction, and a minor axis is in the y axis direction (short axis).

The main coil 2a includes the z main coil (center axis gradient coil) 9z for generating a gradient magnetic field of which magnetic field intensity linearly varies in the z axis direction at the magnetic field region 7, the x main coil (major axis gradient coil) 9x for generating a gradient magnetic field of which magnetic field intensity linearly varies in the x axis direction (major axis direction), and the y main coil (minor axis gradient coil) 9y for generating a gradient magnetic field of which magnetic intensity linearly varies in the y axis direction (minor axis gradient in the minor axis gradient coil) 9y. The gradient coil device 2 is provided in the MRI device 100 so that the magnetic field region (7) where the x main coil 9x, the y main coil 9y, and the z main coil 9z of the main coil 2a generate the gradient magnetic field is superimposed on and to accord the imaging region 7 of the MRI device 100 (see FIG. 2). The x main coil (major axis gradient coil) 9*x* of the main coil 2*a*, the y main coil (minor axis gradient coil) 9*y*, and the z main coil (center axis gradient coil) 9*z* are laminated in this order from a side of the imaging region 7 (z axis) with not-shown insulation layers sandwiched.

The shield coil 2*b* includes the z shield coil (center axis shield coil) 10*z*, an x shield coil (major axis shield coil) 10*x*, and a y shield coil (minor axis shield coil) 10*y*. The z shield coil (center axis shield coil) 10*z*, the y shield coil (minor axis shield coil) 10*y*, the x shield coil (major axis shield coil) 10*x* of the shield coil 2*b* are laminated in this order from a side of the imaging region 7 (z axis) with not-shown insulation layer sandwiched.

Will be described the cause of lamination in this order. The x main coil (major axis gradient coil) 9*x* includes a pair of coils facing in the x direction each other across the z axis (center axis), and the y main coil (minor axis gradient coil) 9*y* includes a pair of coils facing in the y direction each other across the z axis (center axis). Centers of respective coils of the x main coil (major axis gradient coil) 9*x* are more remote in distance from the center (z axis) of the imaging region 7 where the gradient magnetic field is generated than centers of respective coils of the y main coil (minor axis gradient coil) 9*y*. Accordingly, to generate gradient magnetic fields having the same magnetic field intensity, the x main coil (major axis gradient coil) 9*x* requires a larger quantity of magnetic energy than the y main coil (minor axis gradient coil) 9*y*. To decrease the quantity of the magnetic energy as much as the situation allows, the x main coil 9*x* is arranged closer to a side of the imaging region 7 (z axis) than the y main coil 9*y*. The x shield coil 10*x* is arranged on outermost side among coils in the shield coil 2*b* to make a distance from the x main coil 9*x* larger to prevent the gradient magnetic field generated by the x main coil 9*x* from decreasing by decreasing interaction with the x main coil 9*x*.

The z main coil (center axis gradient coil) 9*z* can generate a large magnetic field intensify with a smaller magnetic energy than the x main coil 9*x* and the y main coil 9*y* due to a cause of different coil patterns. Accordingly, the z main coil 9*z* is arranged outermost side of the main coil 2*a*. The z shield coil 10*z* is arranged on an innermost side out of the shield coil 2*b* because a magnetic energy of the z shield coil 10*z* as a whole of the center axis gradient coil does not become larger than the magnetic energy of the major axis gradient coil and the minor axis gradient coil. As a result of the arrangement, the order of arrangement of the x main coil 9*x*, the y main coil 9*y*, and the z main coil 9*z* from the side of the z axis is determined, and the order of the arrangement of the x shield coil 10*x*, the y shield coil 10*y*, the z shield coil 10*z* from the side of the z axis can be determined.

In the description above from point of view for homogenizing magnetic energy the arrangement of the x main coil 9*x*, the y main coil 9*y*, and the z main coil 9*z* and arrangement of the x shield coil 10*x*, the y shield coil 10*y*, and the z shield coil 10*z* has been described in an order (lamination order, distance order) from the side of the z axis. Next, from a point of view of reducing the residual magnetic field to a side of the magnet device 1, an arrangement of the x main coil 9*x*, 9*y*, 9*z* and the shield coils 10*x*, 10*y*, 10*z*, particularly an arrangement of the y main coil 9*y* and the y shield coil 10*y*, which have a tendency toward high intensity residual magnetic field, will be described.

Gaps dxy, dyy of the y main coil 9*y* and the y shield coil 10*y* are different such that the gap dxy in the major axis direction (x direction) is different from the gap dyy in the minor axis direction (y direction) because the cross section shape of the y main coil 9*y* is an ellipse. The gap dyy in the minor axis direction (y direction) is greater than the gap dxy in the major axis direction (x direction) (dxy<dyy). In addition, a gap of the coils is determined, assuming curved surfaces on which the coils are disposed, as a distance (gap) between the curved surfaces or extending planes of the curved surfaces for the respective coils.

Similarly, the gaps dxx, dyx of the x main coil 9*x* and the x shield coil 10*x* are different such that the gap dxx in the major axis direction (x direction) is different from the gap dyx in the minor axis direction (y direction) because the cross section shape of the x main coil 9*x* is an ellipse. Further, the gap dyx in the minor direction (y direction) is wider than the gap dxx in the major axis direction (y direction) (dxx<dyx).

In addition, because the x main coil 9*x* and the x shield coil 10*x* sandwich the y main coil 9*y* and the y shield coil 10*y*, also in the major direction (x direction), a gap dxx between the x main coil 9*x* and the x shield coil 10*x* is wider than a gap dxy between the y main coil 9*y* and the y shield coil 10*y* (dxy<dxx), and also in the minor axis direction (y direction) a gap dyx between the x main coil 9*x* and the x shield coil 10*x* is wider than a gap dyy between the y main coil 9*y* and the y shield coil 10*y* (dyy<dyx).

The gap dyy between the y main coil 9*y* and the y shield coil 10*y* in the minor axis direction (y direction) is wider than the gap dxx between the x main coil 9*x* and the x shield coil 10*x* in the major axis direction (x direction) (dxx<dyy) because the cross section shape of the y main coil 9*y* and the x main coil 9*x* are ellipses.

In addition, the y main coil 9*y* has a pair of coils facing each other in the y direction across the z axis (center axis). Centers of the pair of the coils of the y main coil 9*y* are arranged in the minor axis direction (on the y axis). The closer to the centers (y axis) of the pair of the coils a point is, the larger intensity of the magnetic field the coils generates at the point, which provides a gradient magnetic field inside the coils and a residual magnetic field is generated outside the coils.

Similarly, the x main coil 9*x* has a pair of coils facing in the x direction across the z axis (center axis). Centers of the pair of coils in the x main coil 9*x* are arranged in the major axis direction (on the x axis). The closer to the centers (x axis) of the pair of the coils a point is, the larger intensity of the magnetic field the coils generates at the point, which provides a gradient magnetic field inside the coils and a residual magnetic field is generated outside the coils.

The closer the shield coils 10*y*, 10*x* and the main coils 9*y*, 9*x* are disposed, the larger the advantageous effect on controlling the residual magnetic field the coils have. At a first sight, the x main coil 9*x* and the x shield coil 10*x* are arranged so as to sandwich the y main coil 9*y* and the y shield coil 10*y*. Accordingly it may be supposed that at any point a relation is established in which the gaps (dxx, dyx) between the x main coil 9*x* and the x shield coil 10*x* are wider than the gap (dxy, dyy) anywhere. This is not true, but the gap dyy on the y axis between the y main coil 9*y* and the y shield coil 10*y* is wider than the gap dxx on the x axis between the x main coil 9*x* and the x shield coil 10*x* (dxx<dyy).

In summary, the y main coil 9*y* mainly generates a residual magnetic field from a part of the coil which is periphery in the y axis, and the x main coil 9*x* mainly generates a residual magnetic field from a part of the coil which is periphery in the x axis, the gap dyy between the y main coil 9*y* and the y shield coil 10*y* is wider than the gap dxx between the x main coil 9*x* and the x shield coil 10*x*. Accordingly, the y main coil 9*y* and the y shield coil 10*y* is worse in magnetic shielding effect for the main residual magnetic field than the x main coil 9x and the x shield coil 10x. Therefore, the residual magnetic field from the y main coil 9y and the y shield coil 10y tends to be larger than that from the x main coil 9x and the x shield coil 10x.

FIG. 1B illustrates a cross section view of the gradient coil device 2 according to the first embodiment of the present invention, taken on a plane (yz plane) including the y axis and the z axis. To eliminate the tendency in that the residual magnetic field generated by the y main coil 9y and the y shield coil 10y becomes larger in intensity than the residual magnetic field generated by the x main coil 9x and the x shield coil 10x, a length (a half of the length) Lmy in the center axis direction (z direction) of the y main coil 9y is shorter than a length (a half of the length) Lmx in the center axis direction (z direction) of the x main coil 9x (Lmy<Lmx). This can efficiently reduce the residual magnetic field generated by the y main coil 9y. In FIG. 1B, a length (a half of the length) Lmz in the center axis direction (z direction) of the z main coil 9z is set to be equal to the length (a half of the length) Lmx in the center axis direction (z direction) of the x main coil 9x (Lmx=Lmz), but is not limited to this, and the length Lmz and the length Lmx may be modified to be different from each other (Lmx≠Lmz). In FIG. 1B, a length (a half of the length) Lsy in the center axis direction (z direction) of the y shield coil 10y, the length (a half of the length) Lsx in the center axis direction (z direction) of the x shield coil 10x, and the length (a half of the length) Lsz in the center axis direction (z direction) of the z shield coil 10z are equal to each other (Lsy=Lsx=Lsz). However, the setting is not limited to this, but the length Lsz and the length Lsx can be differentiated from each other (Lsx≠Lsz), and the length Lsz and the length Lsy can be differentiated from each other (Lsy≠Lsz). Further, the length (a half of the length) Lsy in the center axis direction (z direction) of the y shield coil 10y, the length (a half of the length) Lsx in the center axis direction (z direction) of the x shield coil 10x, and the length (a half of the length) Lsz in the center axis direction (z direction) are equal to or shorter than a length L0 of the magnet device 1 (the vacuum vessel 6) in the center axis direction (see FIG. 4A) (Lsy, Lsx, Lsz≤L0).

(Modification 1 of the First Embodiment)

FIG. 4A illustrates a cross section view on a yz plane in first quadrants of the y main coil (minor axis gradient coil) 9y, the y shield coil (minor axis shield coil) 10y, and the x shield coil (major axis shield coil) 10x. FIG. 4A shows, as the modification 1 of the first embodiment, a case where the length (a half of the length) Lsy in the z direction of the y shield coil (minor axis shield coil) 10y is sufficiently longer than the length (a half of the length) Lmy in the z direction of the y main coil (minor axis gradient coil) 9y (Lsy>>Lmy (reference)). Ideally, when the length Lsy of the y shield coil 10y is elongated infinitely, the residual magnetic field toward a side of the vacuum vessel 6 (on a side of the magnet device 1) can be eliminated. However, actually, it is impossible to elongate the length Lsy infinitely. As shown in FIG. 4A, the length Lsy of the y shield coil 10y in the z axis direction is made sufficiently longer than the length Lmy of the y main coil 9y in the z direction. The meaning of "sufficiently longer" is that a difference αa (=Lsy−Lmy) between the lengths Lmy and Lsy satisfies a relation of αa>>βa, that is, a relation βa/αa=ϵ (ϵ is sufficiently small value (for example, not larger than 0.2)) is satisfied.

The length Lsy of the y shield coil 10y is longer than the length Lsx of the x shield coil 10x in the z direction (Lsy>Lsx). Because external dimensions of the MRI device 100 are substantially determined by the external dimensions of the magnet device 1, the x shield coil 10x and the z shield coil 10z are set to have such dimensions as not to protrude from the magnet device 1. More specifically, the length Lsx of the x shield coil 10x in the z direction is equal to or smaller than the length (a half of the length) L0 of the magnet device 1 (the vacuum vessel 6) in the center axis direction (Lsx≤L0). These settings make the length Lsy of the y shield coil 10y in the z axis is longer than the length L0 of the magnet device 1 (the vacuum vessel 6) in the center axis direction (z direction) (Lsy>L0). Accordingly, because only the y shield coil 10y protrudes from the magnet device 1, the oppressive feeling for the target body is small, and the residual magnetic field by the y main coil 9y can be efficiently reduced.

(Modification 2 of the First Embodiment)

FIG. 4B illustrates a cross section view on the yz plane in first quadrants of the y main coil (minor axis gradient coil) 9y, and the y shield coil (minor axis shield coil) 10y. FIG. 4B shows, as the modification 2 of the first embodiment, a case where the length (a half of the length) Lsy in the z direction of the y shield coil (minor axis shield coil) 10y is sufficiently shorter than the length (a half of the length) Lmy in the z direction of the y main coil (minor axis gradient coil) 9y (Lsy (reference)>>Lmy). As shown in FIG. 4B, the length Lsy of the y shield coil 10y in the z direction is equalized to the length L0 of the magnet device 1 (the vacuum vessel 6) (Lsy=L0). In addition, the length Lmy of the y main coil 9y in the z direction is made sufficiently shorter than the length Lsy of the y shield coil 10y in the z direction. The meaning of "sufficiently shorter" is that a difference αb(=Lsy−Lmy) between the lengths Lmy and Lsy satisfies a relation of αb>>βb, that is, a relation βb/αb=ϵ (ϵ is sufficiently small value (for example, not larger than 0.2) is satisfied. Accordingly, because the gradient coil device 2 does not protrude from the magnet device 1, the residual magnetic field by the y main coil 9y can be efficiently reduced without increase in the oppressive feeling for the target body.

(Modification 3 of the First Embodiment)

FIG. 4C illustrates a cross section view on the yz plane in first quadrant of the y main coil (minor axis gradient coil) 9y, and the y shield coil (minor axis shield coil) 10y. FIG. 4C shows, as the modification 3 of the first embodiment, a case where a gap βc between the y main coil 9y and the y shield coil 10y is sufficiently smaller than a difference αc(=Lsy−Lmy) between the length Lmy of the y main coil 9y and the length Lsy of the y shield coil 10y (αc (reference)>>βc). As shown in FIG. 4C, the length Lsy of the y shield coil 10y in the z direction is equalized to a length L0 of the magnet device 1 (the vacuum vessel 6) (Lsy=L0). In addition, the gap βc between the y main coil 9y and the y shield coil 10y is made sufficiently shorter than a difference αc between the length Lmy and the length Lsy (αc (=Lsy−Lmy)). When the gap βc between the y main coil 9y and the y shield coil 10y becomes short, it is easy to decrease the residual magnetic field by the y main coil 9y. To shorten the gap βc between the y main coil 9y and the y shield coil 10y, the laminating order of the y main coil 9y in the main coil 2a having the laminating structure shown in FIG. 1 can be obtained by changing the laminating order of the y main coil 9y to the outside (on a side of the magnet device 1), and the laminating order of the y shield coil 10y to an inner side (side of center axis (z axis)). This also efficiently reduces the residual magnetic field by the y main coil 9y without increase in the oppressive feeling for the target body.

When the length Lmy of the y main coil 9y is sufficiently shorter than the length Lsy of the y shield coil 10y shown in FIG. 4B, (Lsy (reference)>>Lmy), a current density becomes large to keep the number of turns of the y main coil 9y, and the magnetic energy becomes large as the current density becomes large. Accordingly, if the length Lmy of the y main coil 9y can be determined in an approximate range, a magnetic field intensity necessary for generating the imaging region 7 can be kept in addition to the reduction in the residual magnetic field by the y main coil 9y.

The idea above is also applicable to the x main coil 9x and the x shield coil 10x. More specifically, the length Lsx of the x shield coil 10x in the z direction (see FIG. 1B) should be equalized to the length L0 of the magnet device 1 (the vacuum vessel 6) (Lsx=L0), and the length Lmx of the x main coil 9x (see FIG. 1B) in the z direction should be shortened. As shown in FIG. 1A, the x main coil 9x generates the gradient magnetic field at the imaging region (magnetic field) 7 from a remote position due to the major axis as shown in FIG. 1A and the magnetic energy is originally larger than the y main coil 9y. Accordingly, there is little margin to shorten the length Lmx (see FIG. 1B) of the x main coil 9x in the z direction. However, as described above, because the gap dxx between the x main coil 9x and the x shield coil 10x in the major axis direction (x direction) is smaller than the gap dyy between the y main coil 9y and the y shield coil 10y in the minor axis direction (y direction) (dxx<dyy), the residual magnetic field from the x main coil 9x and the x shield coil 10x is smaller than the magnetic field from the y main coil 9y and the y shield coil 10y. Accordingly, it is an appropriate method of making the length Lmy of the y main coil 9y in the z direction shorter than the length Lmx of the x main coil 9x in the z direction to equalize the intensity of the residual magnetic fields of the x main coil 9x and the y shield coil 10y. In addition, the lengths Lmz and Lsz of the z main coil 9z and the z shield coil 10z in the z direction may be or may not be equalized to the lengths Lmx, Lsx of the x main coil 9x and the y shield coil 10y in the z direction.

Next, it will be confirmed to make the length Lmy of the y main coil 9y shorter than the length Lmx in the z direction to reduce the residual magnetic field described above through numerical calculation mentioned later.

FIG. 5A shows a cross section view of the gradient coil device 2A of a comparative example 1, taken on the xy plane, and FIG. 5B shows a cross section of the gradient coil device 2A of the comparative example 1. As shown in FIG. 5A, the comparative example 1 is different from the first embodiment in that the cross sectional shape of the (gradient magnetic field) main coil 2a is circle. Further there is a difference in that the z shield coil 10z, the x shield coil 10x, and the y shield coil 10y of the shield coil 2b are laminated from a side of the imaging region (magnetic field space) 7 in this order. Because both the x main coil 9x and the y main coil 9y have cross section shapes of circles, the magnetic energies of both are equal to each other when they are disposed at the same radius distance positions. However, actually the x main coil 9x and the y main coil 9y are arranged with a shift in a radial direction to avoid interference therebetween. The x main coil 9x is arranged on an inner side of the y main coil 9y (side of center axis). Accordingly to suppress a difference in a magnetic energy the y main coil 9y and the y shield coil 10y from the x main coil 9x and the x shield coil 10x, the gaps dxx, dyx between the x main coil 9x and the x shield coil 10x and the gaps dxy, dyy between the y main coil 9y and the y shield coil 10y are equalized (dyx=dxx=dyy=dxy) by changing the laminating order from the first embodiment. Further, the z main coil 9z which can easily generate a magnetic field is arranged on an outermost side of the main coil 2a, and the z shield coil 10z is arranged on an innermost side of the shield coil 2b.

As shown in FIG. 5A, a length Lmx of the x main coil 9x in the z direction and a length Lmy of the y main coil 9y, and a length Lmz of the z main coil 9z are equalized each other (Lmx=Lmy=Lmz). Further, a length Lsx of the x shield coil 10x in the z direction, a length Lsy of the z shield coil 10z, and a length Lsz of the z shield coil 10z in the z direction are equalized (Lsx=Lsy=Lsz).

Figure 6:
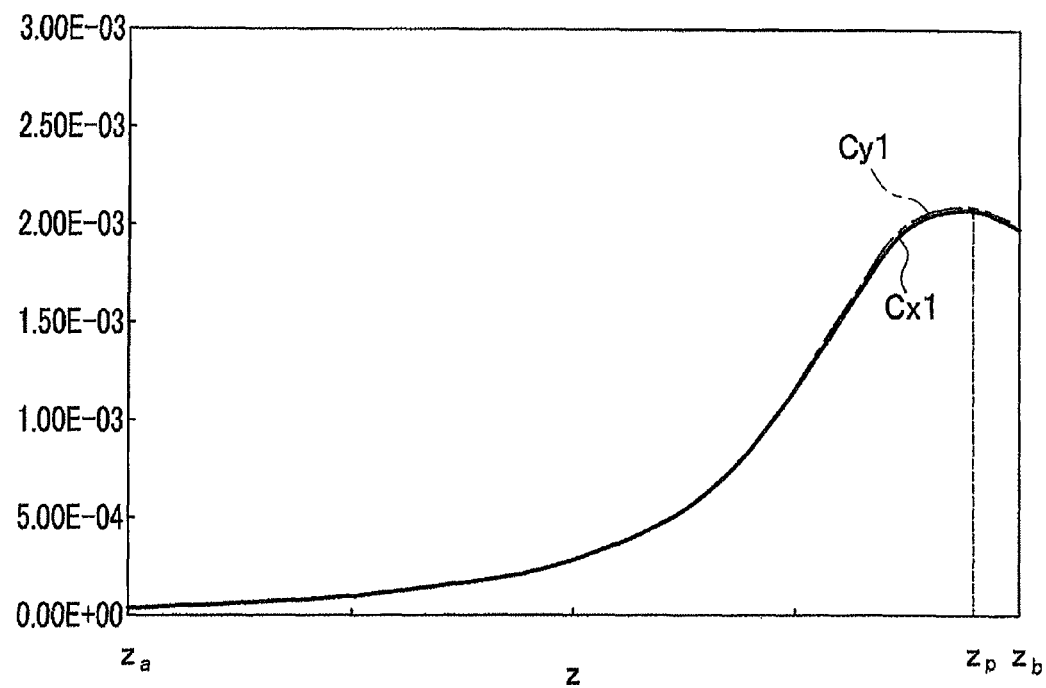
FIG. 6 is a chart illustrating the y component of the magnetic flux density vertical to the z axis generated in a region Cy1 by the y main coil and the y shield coil of the comparative example 1 and the x component of the magnetic flux density vertical to the z axis generated in a region Cx1 by the x main coil and the x shield coil.

FIG. 6 shows a y component of a magnetic flux density (residual magnetic field) generated in a region Cy1 by the y main coil 9y and the y shield coil 10y of the comparative example 1 and a y component of a magnetic flux density (residual magnetic field) vertical to the z axis generated at the region Cx1 by the x main coil 9x and the x shield coil 10x. The region Cy1 is, as shown in FIGS. 5A and 5B, a region remote from the shield coil 2b in the minor axis direction and at a range of z coordinates za to zb at a part at an edge in the z direction of the shield coil 2b. Particularly, a z coordinate zb agrees with a z coordinate at the end surface of the shield coil 2b. The region Cx1 is a region remote from the shield coil 2b in the major axis direction and at a range of z coordinates za to zb at an edge in the z direction of the shield coil 2b. It is supposed that both the region Cy1 and the region Cx1 are regions where the residual magnetic field become largest among the regions at the magnet device 1 (see FIG. 2) is disposed.

The magnetic flux density distribution (by the x main coil 9x and the x shield coil 10x) at the region Cx1 is drawn with a solid line, and the magnetic flux density distribution (by the y main coil 9y and the y shield coil 10y) at the region Cy1 is drawn with a chain line. These magnetic flux density distributions are well coincide with each other, and both have maximum value at the z coordinate zp. The magnetic flux density distribution at the region Cy1 is slightly larger than the magnetic flux density distribution of the region Cx1. This is because the y main coil 9y is disposed outer than the x main coil 9x, and the y shield coil 10y is disposed outer than an x shield coil 10x.

Figure 7:
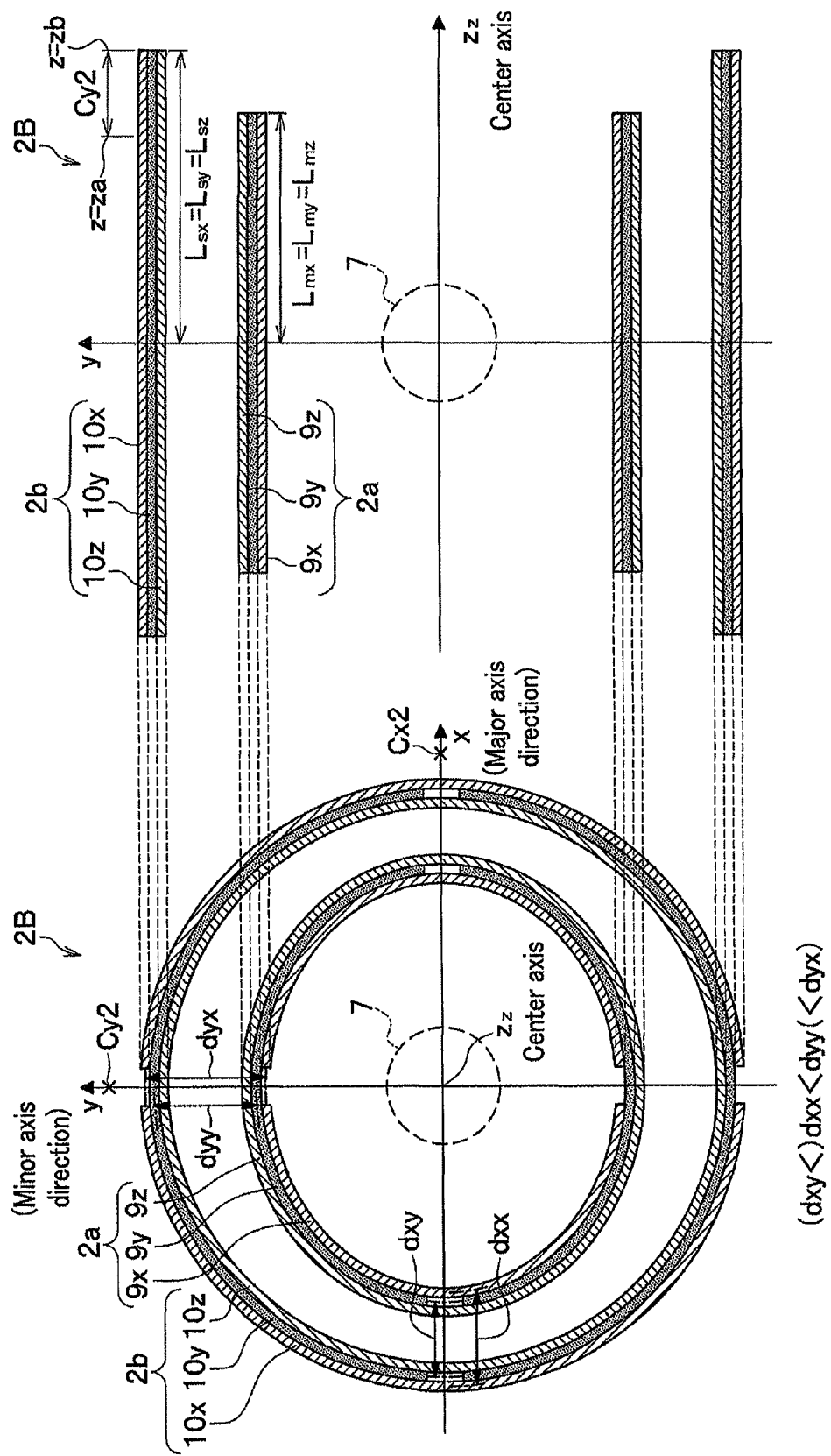
FIG. 7A is a cross section view of the gradient coil device of a comparative example 2 taken on the xy plane.
FIG. 7B is a cross section view of the gradient coil device of the comparative example 2 taken on a yz plane.

FIG. 7A shows a cross section view of the gradient coil device 2B of a comparative example 2 taken on the xy plane, and FIG. 7B shows a cross section of the gradient coil device 2B taken on the yz plane of the comparative example 2. As shown in FIG. 7B, the comparative example 2 is different from the first embodiment in that the length Lmy of the y main coil 9y in the z direction is equal to the length Lmx of the x main coil 9x in the z direction, and the length Lmz of the z main coil 9z in the z direction.

Figure 8:
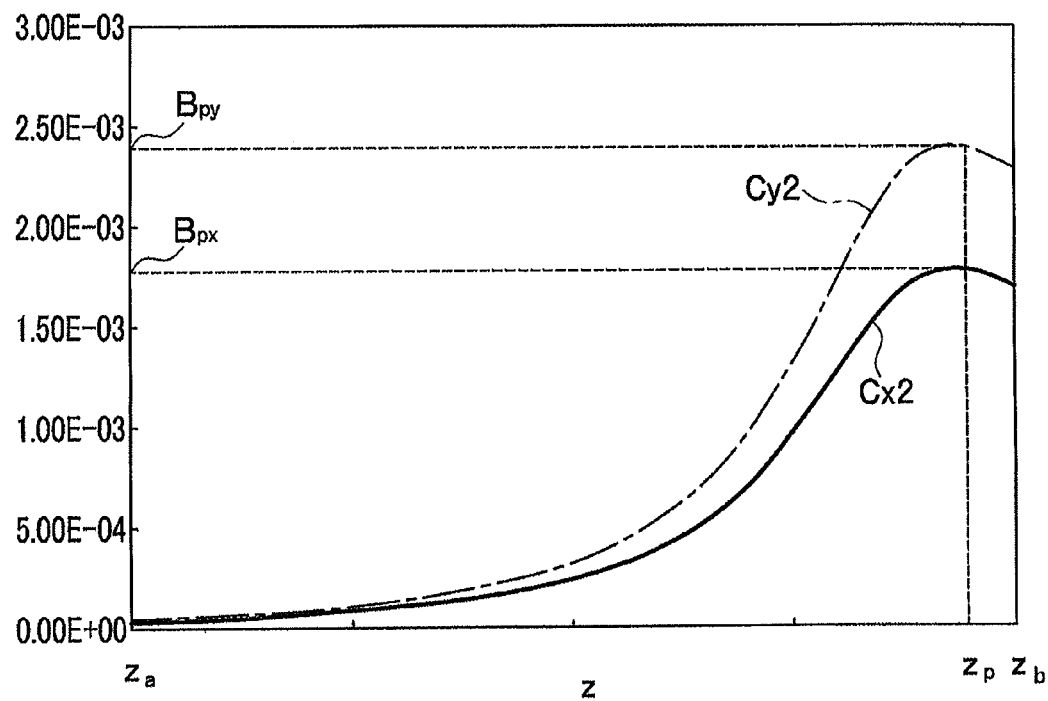
FIG. 8 is a chart illustrating the y component of the magnetic flux density vertical to the z axis generated in a region Cy2 by a y main coil (a minor axis gradient coil) and a y shield coil (a minor axis shield coil) of the comparative example 2 and the x component of the magnetic flux density vertical to the z axis generated in a region Cx2 by an x main coil (a major axis gradient coil) and an x shield coil (a major axis shield coil).

FIG. 8 shows a y component of a magnetic flux density (residual magnetic field) generated in a region Cy2 by the y main coil 9y and the y shield coil 10y of the comparative example 2 and an x component of a magnetic flux density (residual magnetic field) vertical to the z axis generated at the region Cx2 by an x main coil 9x and the x shield coil 10x. The region Cy2 is, as shown in FIGS. 7A and 7B, a region remote from the shield coil 2b in the minor axis direction and at a range of z coordinates za to zb at a part at an edge in the z direction of the shield coil 2b. Particularly, a z coordinate zb agrees with a z coordinate at the end surface of the shield coil 2b. A region Cx2 is a region remote from the shield coil 2b in the major axis direction and at a range of z coordinates za to zb at a part at an edge in the z direction of the shield coil 2b. It is supposed that both the region Cy2 and the region Cx2 are regions where the residual magnetic field becomes largest among the regions at the magnet device 1 (see FIG. 2) is disposed.

The magnetic flux density distribution (by the x main coil 9x and the x shield coil 10x) in the region Cx2 is drawn with a solid line, and the magnetic flux density distribution (by the y main coil 9y and the y shield coil 10y) at the region Cy2 is drawn with a chain line. The magnetic flux density distribution (residual magnetic field) in the region Cy2 is slightly larger than the magnetic flux density distribution (residual magnetic field) of the region Cx2. Respective magnetic flux density distributions both have maximum values Bpy, Bpx at the z coordinate zp. The maximum value Bpy of the magnetic flux density distribution (residual magnetic field) in a region Cy2 becomes larger than the maximum value Bpx of the magnetic flux density distribution (residual magnetic field) in the region Cx2.

Accordingly, from comparison between the comparative examples 1 and 2 it is confirmed through a numerical computation that the residual magnetic field by the y main coil 9y becomes larger than the residual magnetic field by the x main coil 9x when the cross section shape of the main coil 2a is changed from a circle to an ellipse.

In the comparative example 2, when the length Lmy of the y main coil 9y in the z direction is shortened relative to the length Lmx of the x main coil 9x in the z direction, this becomes the same as the first embodiment. In the later description, it will be confirmed that the residual magnetic field by the y main coil 9y becomes low when the length Lmy of the y main coil 9y in the z direction is shortened.

Figure 9A:
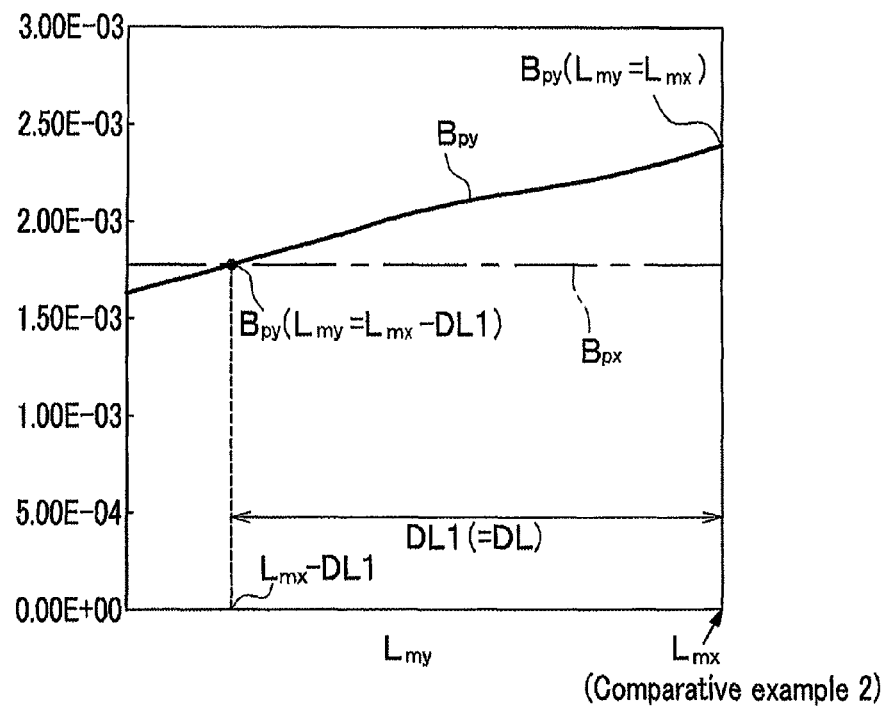
FIG. 9A is a chart of maximum values of the y component vertical to the z axis of a magnetic flux density generated at a region Cy2 by the y main coil (minor axis gradient coil) and the y shield coil (minor axis shield coil) with respect to a length in the z direction of the y main coil (the minor axis gradient coil).

FIG. 9A shows a chart of maximum values of the y component vertical to the z axis of the magnetic flux density generated in the region Cy2 by the y main coil 9y and the y shield coil 10y of the first embodiment with respect to the length Lmy of the y main coil 9y in the z direction. When the length Lmy in the axis of abscissa in the chart is equal to the length Lmx of the x main coil 9x in the z direction (Lmy=Lmx), this corresponds to the case of the comparative example 2. It can be understood that the shorter the length Lmy becomes than the length Lmx, the smaller the maximum values Bpy (residual magnetic field) becomes.

The maximum value Bpx of the x component of the magnetic flux density generated in the region Cx2 by the x main coil 9x and the x shield coil 10x vertical to the z axis (residual magnetic field) is a constant value in FIG. 9A because the maximum value Bpx is determined not dependent on the length Lmy but independently determined. Accordingly, when the length Lmy is shortened from the length Lmx by difference DL1 (Lmy=Lmx−DL1), the maximum value Bpy (residual magnetic field by the y main coil 9y) can be equalized to the maximum value Bpx (residual magnetic field by the x main coil 9x) (Bpy=Bpx). In addition, when the length Lmy is shortened (Lmy<Lmx−DL1), the maximum value Bpy (residual magnetic field by the y main coil 9y) can be made smaller than the maximum value Bpx (residual magnetic field by the x main coil 9x) (Bpy<Bpx).

This is effective because when the difference DL for shortening the length Lmy relative to the length Lmx is not zero but positive (DL>0), the maximum value Bpy (residual magnetic field by the y main coil 9y) can be made small. Further, when the difference DL is greater than the difference DL1, (DL≥DL1), the maximum value Bpy (residual magnetic field by the y main coil 9y) can be made further smaller than the maximum value Bpx (residual magnetic field by the x main coil 9x) (Bpy≤Bpx).

In addition, deterioration of the tomographic image due to the residual magnetic field is determined by one of the maximum value Bpy (residual magnetic field by the y main coil 9y) and the maximum value Bpx (residual magnetic field by the x main coil 9x) which is larger than the other, so that it is sufficient to decrease the maximum value Bpy (residual magnetic field by the y main coil 9y) to the maximum value Bpx (residual magnetic field by the 9x). Then, it can be supposed that the difference DL is preferably equalized to the value of the difference DL1 (DL=DL1).

Figure 9B:
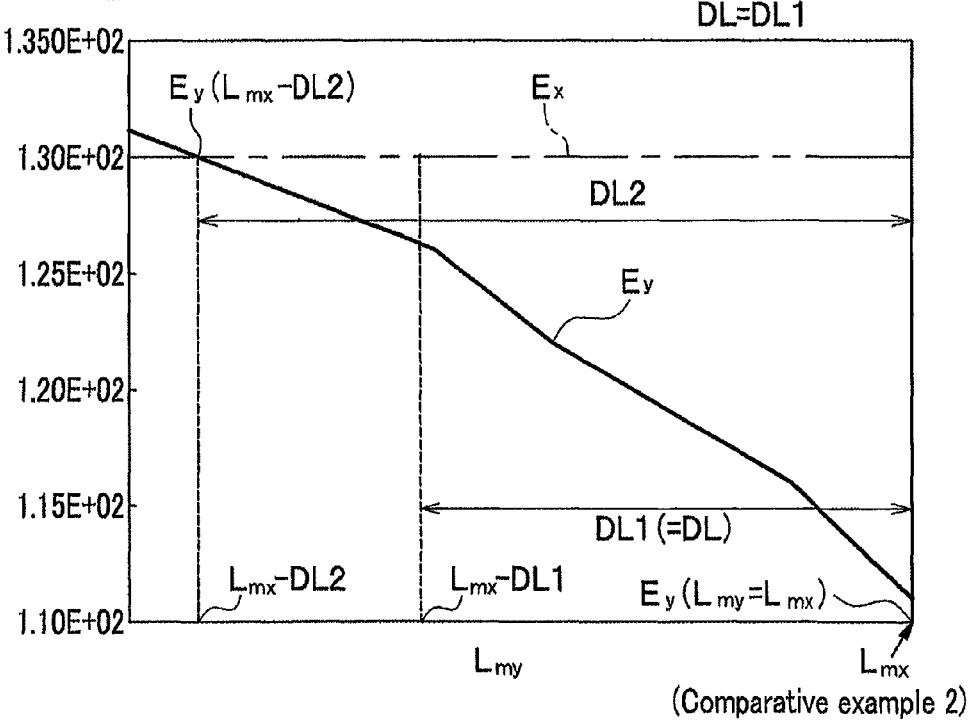
FIG. 9B is a chart of magnetic energies stored in the y main coil (minor axis gradient coil) and the y shield coil (minor axis shield coil) according to the first embodiment with respect to a length of the y main coil (minor axis gradient coil) in the z direction.

FIG. 9B shows a chart of a magnetic energy Ey stored in the y main coil 9y and the y shield coil 10y of the first embodiment with respect to the length Lmy of the y main coil 9y in the z direction. When the length Lmy in the axis of abscissa in the chart is equal to the length Lmx of the x main coil 9x in the z direction (Lmy=Lmx), this corresponds to the case of the comparative example 2. The length Lmy of the abscissa of the chart is equal to the length Lmx of the x main coil 9x in the z direction (Lmy=Lmx), this corresponds to the case of the comparative example 2. It can be understood that the shorter the length Lmy becomes than the length Lmx, the larger the magnetic energy Ey becomes.

The magnetic energy Ex stored in the x main coil 9x and the x shield coil 10x is determined not depending on the length Lmy, but independently determined and the length Lmx is fixed. The energy Ex is a constant value in FIG. 9B. Accordingly, when the length Lmy is shortened from the length Lmx by a difference DL2 (Lmy=Lmx−DL2), the magnetic energy Ey can be equalized to the magnetic energy Ex (Ey=Ex). Accordingly, when the difference DL for shortening the length Lmy relative to the length Lmx is equal to or smaller than the difference DL2 (DL≤DL2), the magnetic energy Ey can be made equal to or smaller than the magnetic energy Ex (Ey≤Ex).

In the first embodiment, the difference DL2 is equal to or greater than the difference DL1 (DL1≤DL2). Accordingly, a difference DL which is equal to or smaller than the difference DL2 (DL≤DL2) and equal to or greater than the difference DL1 (DL≥DL1) can be set as (DL1≤DL≤DL2). Particularly, the difference DL can be set to the difference DL1 (DL=DL1).

Unlike the first embodiment, it is assumed that the difference DL2 is smaller than the difference DL1 (DL2<DL1). In this case, it is impossible to set the difference DL which is equal to or smaller than the difference DL2 (DL≤DL2) and equal to or greater than the difference DL1 (DL≥DL1) ((DL≤) DL2<DL1 (≤DL)). In such a case, it is possible to set the difference DL to the difference DL2 (DL=DL2). Also this can decrease the residual magnetic field generated by the y main coil 9y. Accordingly, it is better to set the difference DL to a smaller one of the difference DL1 and the difference DL2.

In addition, it can be understood that the length Lmy of the y main coil 9y and the length Lmx of the x main coil 9x can be determined by a method as described later. First, the length Lmx is determined to have a value of the residual magnetic field required. Next, the difference DL is set to the difference DL2 which makes the magnetic energy Ey to the magnetic energy Ex by shorting the length Lmy (increasing the difference DL). Here, the difference DL is set to the difference DL1 when the difference DL reaches the difference DL1 before reaching the difference DL2.

As described above, when the length Lmy of the y main coil 9y in the z axis is shortened relative to the length Lmx of the x main coil 9x, an optimum arrangement can be obtained because the magnetic energy Ey, Ex are equalized with the respective residual magnetic fields to be approximately equalized.

FIG. 10A shows a coil pattern view in which the y main coil 9y is spread in a circumferential direction (θ direction) of the center axis (z axis). FIG. 10B shows a coil pattern view in which the x main coil 9x is spread in the circumferential direction (θ direction) of the center axis (z axis). From these views, it can be understood that the length Lmy of the y main coil 9y is shorter than the length Lmx of the x main coil 9x in the z direction by the difference DL.

FIG. 12A shows a coil pattern view in which the y shield coil 10y is spread in the circumferential direction (θ direction) of the center axis (z axis). FIG. 12B shows a coil pattern view in which the x shield coil 10x is spread in the circumferential direction (θ direction) of a center axis (z axis). The number of turns of the x shield coil 10x in the coil pattern is 13. On the other hand, the number of turns of the y shield coil 10y in the coil patterns is 1. Then it can be understood that the number of turns of the y shield coil 10y becomes smaller than the number of turns of the x shield coil 10x.

(Second Embodiment)

Figure 11B:
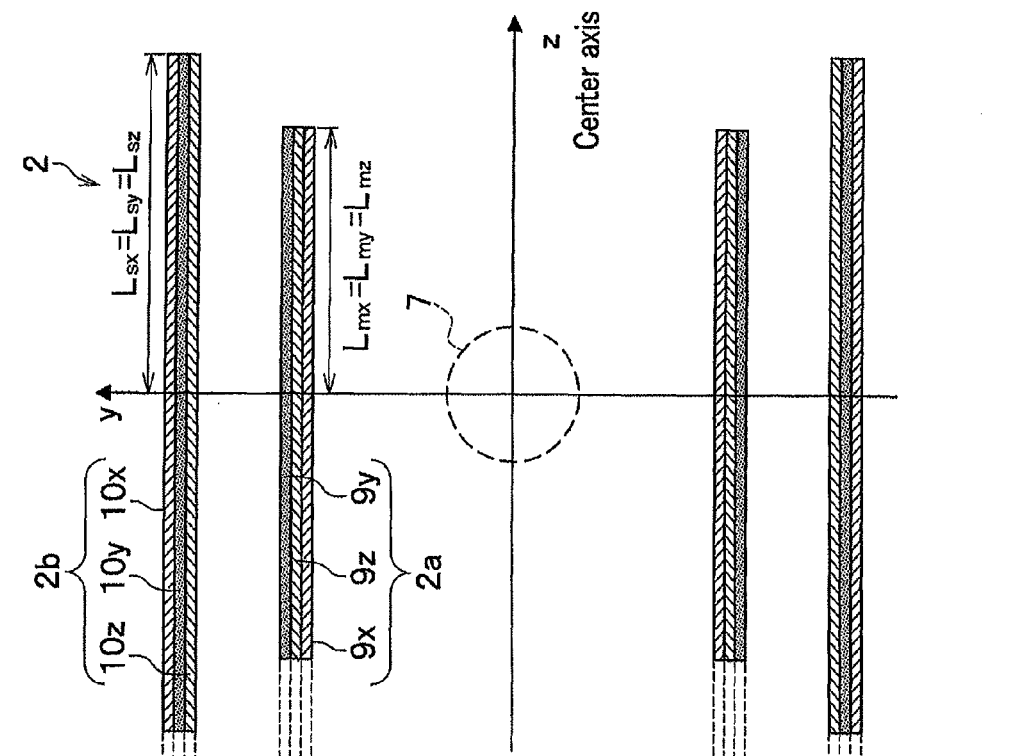
FIG. 11B shows a cross section of the gradient coil device taken on the yz plane.
Figure 11A:
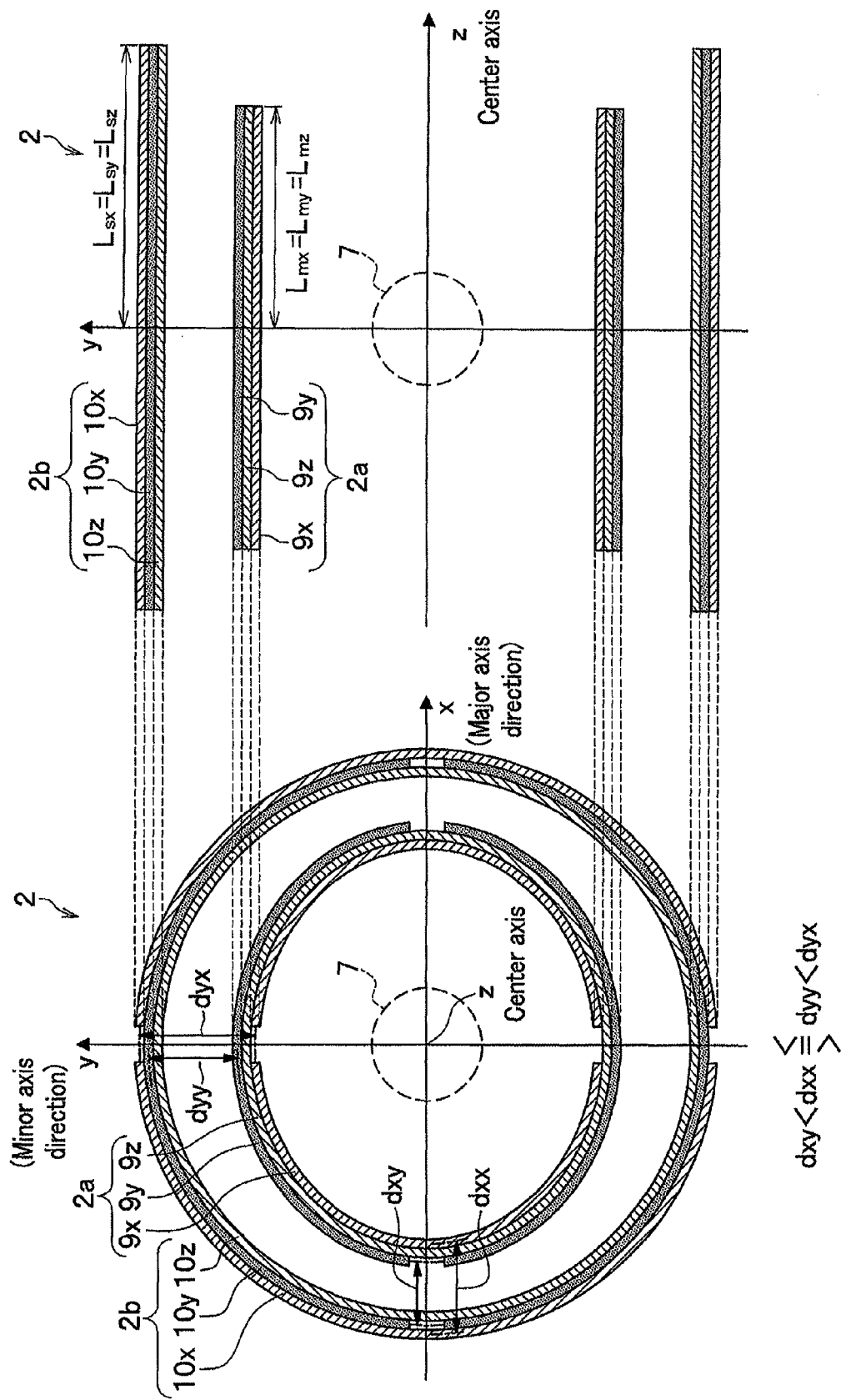
FIG. 11A is a cross section view of the gradient coil device according to a second embodiment of the present invention taken on the xy plane.

FIG. 11A shows a cross section of the gradient coil device 2 according to the second embodiment of the present invention taken on the plane including the x axis and the y axis (xy plane). FIG. 11B shows a cross section view of the gradient coil device 2 according to the second embodiment of the present invention taken on the plane including the y axis and the z axis (yz plane). A difference of the second embodiment from the first embodiment is in the laminating order of the main coil 2a. The main coil 2a is laminated from a side of the imaging region (magnetic field space) 7 (z axis) in the order of the x main coil 9x, the z main coil 9z, and the y main coil 9y. More specifically, the y main coil 9y is arranged on an outermost side of the main coil 2a, and the x main coil 9x and the z main coil 9z are provided on the side of the imaging region (magnetic field space) 7 (z axis) with respect to the y main coil 9y. This can make the gap βc (see FIG. 4C) between the y main coil 9y and the y shield coil 10y like the modification 3 of the first embodiment. Accordingly, the residual magnetic field of the y main coil 9y can be reduced. Therefore, it can be omitted to shorten the length Lmy of the y main coil 9y in the z direction in the first embodiment, but may be done together. When these are done, it can be done to synergistically reduce the residual magnetic field generated by the y main coil 9y. In the second embodiment, a magnetic energy Ey becomes large. However, also it is desirable that the magnetic energy Ey is smaller than a magnetic energy Ex (Ey<Ex). In addition, when the gap βc (see FIG. 4C) is made narrow like the modification 3 of the first embodiment, the laminating order of the shield coil 2b can be changed. More specifically, the y shield coil 10y can be arranged on a side of the shield coil 2b nearest the imaging region (magnetic field space) 7 (z axis). More specifically, the y shield coil 10y may be arranged on a side of the imaging region (magnetic field space) 7 (z axis) with respect to the x shield coil 10x and the z shield coil 10z.

DESCRIPTION OF REFERENCE SYMBOLS

1 magnet device
2 gradient coil device
2a main coil
2b shield coil
6 vacuum vessel
7 imaging region (magnetic field space)
9x x main coil 9x (major axis gradient coil)
9y y main coil 9y (minor axis gradient coil)
9z z main coil (center axis gradient coil)
10x x shield coil (major axis shield coil)
10y y shield coil (minor axis shield coil)
10z z shield coil (center axis shield coil)
100 MRI device (magnetic resonance imaging device)

The invention claimed is:

1. A gradient coil device comprising:
   a major axis gradient coil, having a cross section shape vertical to a center axis direction which is an ellipse, configured to generate a gradient magnetic field having a magnetic field intensity inclined in a major axis direction of the ellipse at a magnetic field space; and
   a minor axis gradient coil, having a cross section shape vertical to the center axis direction which is an ellipse, configured to generate a gradient magnetic field having a magnetic field intensity inclined in a minor axis direction of the ellipse at the magnetic field space,
   wherein the length ($L_{my}$) of the minor axis gradient coil in the center axis direction is shorter than the length ($L_{mx}$) of the major axis gradient coil in the center axis direction.

2. The gradient coil device as claimed in claim 1, wherein a magnetic energy of the minor axis gradient coil is equal to or smaller than a magnetic energy of the major axis gradient coil.

3. The gradient coil device as claimed in claim 1, wherein a maximum value of a residual magnetic field generated by the minor axis gradient coil at a space outside the magnetic field space is equal to or smaller than a maximum value of a residual magnetic field generated by the major axis gradient coil at a space outside the magnetic field space.

4. The gradient coil device as claimed in claim 1, further comprising:
   a major axis shield coil, having a cross section shape vertical to a center axis direction which is circular, configured to suppress a residual magnetic field generated by the major axis gradient coil at a space outside the magnetic field space; and
   a minor axis shield coil, having a cross section shape vertical to the center axis direction which is circular, configured to suppress a residual magnetic field generated by the minor axis gradient coil at a space outside the magnetic field space
   wherein the lengths ($L_{mx}$ and $L_{my}$) of the major axis shield coil and the minor axis shield coil in the center axis direction are equal to or smaller than the length ($L_0$), in the center axis direction, of a magnet device configured to superimpose a static magnetic field having a homogeneous magnetic field intensity at the magnetic field space.

5. The gradient coil device as claimed in claim 1, further comprising:
   a major axis shield coil, having a cross section shape vertical to the center axis direction which is circular, configured to suppress a residual magnetic field generated by the major axis gradient coil at a space outside the magnetic field space; and
   a minor axis shield coil , having a cross section shape vertical to the center axis direction which is circular, configured to suppress a residual magnetic field generated by the minor axis gradient coil at a space outside the magnetic field space,
   wherein the lengths ($L_{sx}$ and $L_{sy}$) of the major axis shield coil and the minor axis shield coil in the center axis direction are equal to each other.

6. A gradient coil device comprising:
   a major axis gradient coil, having a cross section shape vertical to a center axis direction which is an ellipse, configured to generate a gradient magnetic field having a magnetic field intensity inclined in a major axis direction of the ellipse at a magnetic field space;

a minor axis gradient coil, having a cross section shape vertical to the center axis direction which is an ellipse, configured to generate a gradient magnetic field having a magnetic field intensity inclined in a minor axis direction of the ellipse at the magnetic field space;

a major axis shield coil, having a cross section shape vertical to the center axis direction which is circular, configured to suppress a residual magnetic field generated by the major axis gradient coil at a space outside the magnetic field space; and a minor axis shield coil, having a cross section shape vertical to the center axis direction which is circular, configured to suppress a residual magnetic field generated by the minor axis gradient coil at a space outside the magnetic field space, wherein the length ($L_{sy}$) of the minor axis shield coil in the center axis direction is longer than the length ($L_{sx}$) of the major axis shield coil in the center axis direction.

7. The gradient coil device as claimed in claim 6, wherein the length ($L_{sy}$) of the minor axis shield coil in the center axis direction exceeds a length ($L_0$) of a magnet device configured to superimpose a static magnetic field having a homogeneous magnetic field intensity at the magnetic field space, and wherein the length ($L_{sx}$) of the major axis shield coil in the center axis direction is equal to or shorter than the length ($L_0$) of the magnet device.

8. A magnetic resonance imaging device comprising:

the gradient coil device as claimed in claim 1, wherein the magnetic field space is an imaging region.

* * * * *